(12) United States Patent
Podzemny et al.

(10) Patent No.: US 9,797,930 B2
(45) Date of Patent: Oct. 24, 2017

(54) VOLTAGE SENSOR DEVICE

(71) Applicant: ABB Technology AG, Zurich (CH)

(72) Inventors: Jaromir Podzemny, Brno (CZ); Marek Pavlas, Otnice (CZ); Miroslav Hrabcik, Nemcice nad Hanou (CZ); Radek Javora, Brno (CZ)

(73) Assignee: ABB Schweiz AG, Baden (CH)

( * ) Notice: Subject to any disclaimer, the term of this patent is extended or adjusted under 35 U.S.C. 154(b) by 121 days.

(21) Appl. No.: 14/450,351

(22) Filed: Aug. 4, 2014

(65) Prior Publication Data

US 2015/0035553 A1    Feb. 5, 2015

(30) Foreign Application Priority Data

Aug. 2, 2013   (EP) ..................................... 13003868

(51) Int. Cl.
*G01R 27/08* (2006.01)
*G01R 15/06* (2006.01)
*G01R 27/02* (2006.01)
*G01R 15/04* (2006.01)

(52) U.S. Cl.
CPC ............. *G01R 15/06* (2013.01); *G01R 15/04* (2013.01); *G01R 27/02* (2013.01)

(58) Field of Classification Search
CPC ........ G01R 15/00; G01R 15/04; G01R 15/06; G01R 15/14; G01R 15/16; G01R 27/02; G01R 1/203; G01R 15/066; G01R 19/0084; G01R 27/025; G01R 1/04; G01R 19/0092
USPC ...... 324/705, 691, 713, 72.5, 126, 127, 156, 324/538, 551; 323/352, 353; 361/56, 57
See application file for complete search history.

(56) References Cited

U.S. PATENT DOCUMENTS

| 1,047,742 A | 12/1912 | Buchanan |
| 2006/0012382 A1 | 1/2006 | Yakymyshyn et al. |
| 2013/0169263 A1* | 7/2013 | Garabieta Artiagoitia ................ H01C 1/16 323/369 |

(Continued)

FOREIGN PATENT DOCUMENTS

| DE | 606438 C | 12/1934 |
| DE | 10024335 A1 | 11/2000 |
| WO | WO 99/14604 A1 | 3/1999 |

OTHER PUBLICATIONS

European Search Report dated Feb. 2, 2014, for European Application No. 13003868.0.

*Primary Examiner* — Arleen M Vazquez
*Assistant Examiner* — Steven Yeninas
(74) *Attorney, Agent, or Firm* — Taft Stettinius & Hollister LLP (57) ABSTRACT

An exemplary voltage sensor device includes at least one high voltage segment and at least one low voltage impedance element. In order to enhance the power dissipation due to impedances spread inside of the device body, the sensor device can be adapted or extended such that at least one high voltage segment, and at least one low voltage impedance element are arranged on an elongated insulating support with adaptive complementary mechanical and electrical interconnection elements on at least one end of the support element. The mechanical and electrical interconnection elements provide a manner of interconnecting at least two elongated insulating supports together in a pivotable way.

7 Claims, 6 Drawing Sheets

(56) References Cited

U.S. PATENT DOCUMENTS

2016/0020586 A1* 1/2016 Juge .................. H02B 7/01
361/604

* cited by examiner

VOLTAGE SENSOR DEVICE

RELATED APPLICATION(S)

This application claims priority under 35 U.S.C. §119 to European application EP 13003868.0 filed in Europe on Aug. 2, 2013, the entire content of which is hereby incorporated by reference.

FIELD

The disclosure relates to a voltage sensor device, with at least one high voltage segment, and at least one low voltage impedance element.

BACKGROUND INFORMATION

Known voltage sensor devices have sensing elements based on voltage divider, which generally consist of the high voltage impedance, e.g. a resistor part and a low voltage impedance part. According to the specified application parameters, e.g., voltage and ratio, the sensing element can be bulky and thus not fit the insulating sensor body available.

Furthermore heat dissipated from used impedance elements during operation can flow upwards, heating up other parts of impedance elements that can limit parameters under which the divider is operating.

An embodiment of the disclosure is shown in FIGS. 1 to 6.

SUMMARY

An exemplary voltage sensor device is disclosed, comprising: at least one high voltage segment; at least one low voltage impedance element; and at least one elongated insulating support having first adaptive complementary mechanical and electrical interconnection elements for pivotably interconnecting with second adaptive complementary mechanical and electrical interconnection elements of at least one other insulating support, wherein the at least one low voltage impedance element is arranged on the at least one elongated insulating support.

An exemplary voltage sensor device is disclosed, comprising: a plurality of high voltage segments, each high voltage segment having at least one low voltage impedance element; and at least two elongated insulating supports that support the high voltage segments, wherein a first insulating support has first mechanical and electrical interconnection elements for electrically and pivotably interconnecting with second mechanical and electrical interconnection elements of a second insulating support.

DESCRIPTION OF THE DRAWINGS

The disclosure and its embodiments will become apparent from the example and its embodiments described below in connection with the appended drawings which illustrate.

DETAILED DESCRIPTION

Exemplary embodiments of the present disclosure enhance the power dissipation due to impedances spread inside of the device body.

According to an exemplary embodiment of the present disclosure, the sensing element is adaptive and/or extendable such that at least one high voltage segment and at least one low voltage impedance element are arranged on an elongated insulating support (30) with adaptive complementary mechanical and electrical interconnection elements (71-79) on at least one end of the support element, in order to interconnect at least two such support elements together in a pivotable way.

According to another exemplary embodiment the sensor device can be dimensionally adapted by the aforesaid adaptive mechanical and electrical interconnection system and/or pivoted by an angle among the segments or supports.

A further exemplary embodiment provides that the segmentation and placement of impedance elements allows a relative position under an angle which is smaller than 180°.

According to another exemplary embodiment disclosed herein, the resulting value of impedance of the impedance elements can be built up together from standard impedance elements values.

Furthermore, the impedance elements can be either resistive elements or capacitive elements or combination of both.

In an exemplary embodiment of the present disclosure, the impedance elements are connected within given segment in parallel and/or in series, providing required impedance value.

According to another exemplary embodiment, the elements can be assembled into at least partly fixed configuration with at least partly given dimensions and at least partly fixed angle between elements, having main fixed insulating support consisting of several elements and/or further possible connection to other separate elements.

A further exemplary embodiment provides that the fixed insulating support can be reduced in size by mechanically reducing the number of elements through a breaking or cutting off the unused part of said support.

Figure 1:
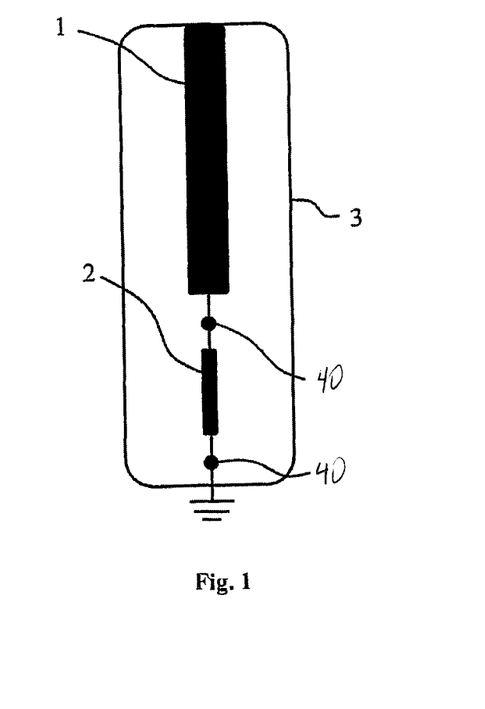
FIG. 1 illustrates an adaptive voltage sensing in accordance with an exemplary embodiment of the present disclosure.
Figure 2:
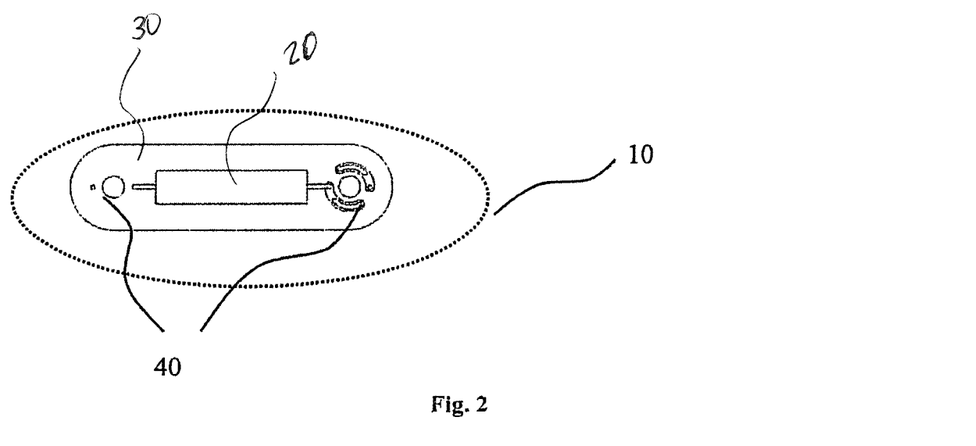
FIG. 2 illustrates a connection system of the voltage sensing element in accordance with an exemplary embodiment of the present disclosure.

Exemplary embodiments disclosed herein provide an adaptive voltage sensing element assembled from segments 10. FIG. 1 illustrates an adaptive voltage sensing element in accordance with an exemplary embodiment of the present disclosure. As shown in FIG. 1, the voltage sensing element can consists of (e.g., includes) a high voltage part 1, a low voltage part 2, an insulating sensor body 3, and a connection system 40. FIG. 2 illustrates a connection system of the voltage sensing element in accordance with an exemplary embodiment of the present disclosure. As shown in FIG. 2, the high voltage part includes at least one segment 10. Such segment is further called high voltage segment. The low voltage part can be placed on a separate segment (e.g., low voltage segment) or it can be located on one of the high voltage segments. The segment 10 includes at least one impedance element 20, an insulated support 30 and connection system 40. Said connection system serves a mechanical purpose and for conductive segments interconnection. The connection system allows an angle 50 between the segments 10 to be changed and a position of the resistive elements to be adjusted.

The exemplary embodiments described above allows an adaptation of dimensions 60 of voltage sensing element.

The impedance 20 can be placed on one side, both sides or alternately on one and the other side (e.g., opposite sides) of the insulation support 30. In addition to providing space benefits the exemplary device described herein provides, better power dissipation due to impedances spread inside of the device body 3, better power dissipation due to impedance placement on both sides of the insulating support 30, longer creepage distance of the functional parts, and a resulting value of the impedance can be assembled from standard values (rows) thereby decreasing final costs.

Figure 3:
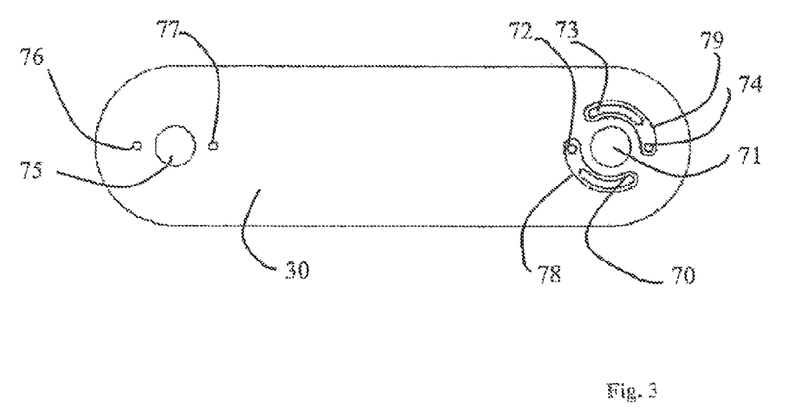
FIG. 3 illustrates an insulating support 30 in accordance with an exemplary embodiment of the present disclosure.
Figure 4:
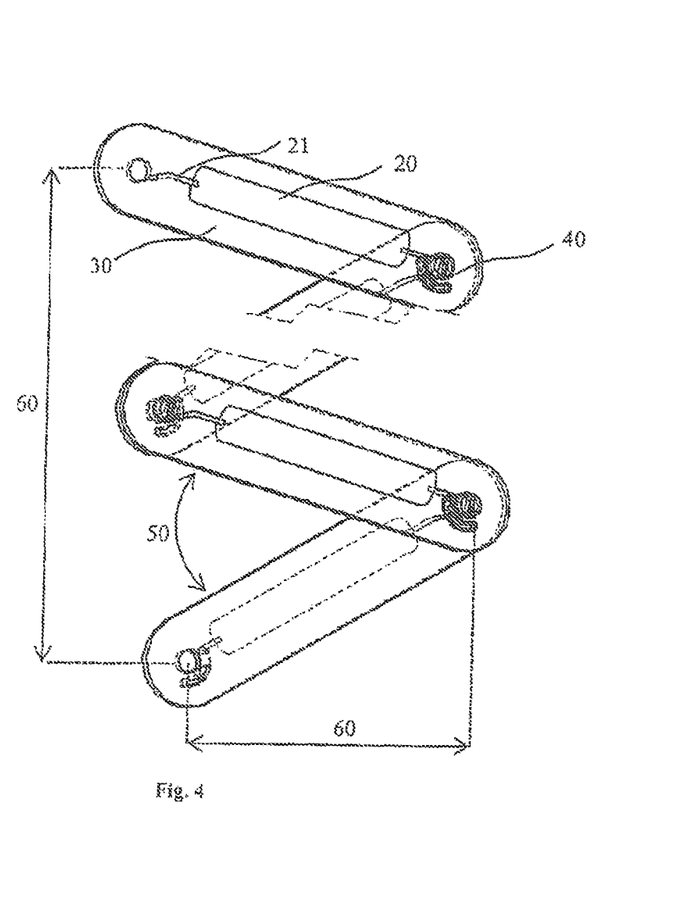
FIG. 4 illustrates a first arrangement of interconnected insulating supports in accordance with an exemplary embodiment of the present disclosure.

FIG. 3 illustrates an insulating support 30 in accordance with an exemplary embodiment of the present disclosure. FIG. 4 illustrates an arrangement of interconnected insulating supports in accordance with an exemplary embodiment of the present disclosure Its connection system 40 consists of (e.g., includes) special connection features provided on insulating support 30. Such connection system 40 has two ends. At both ends of insulating support 30, the connection system has holes 75 and 71, through which the segments are fixed to each other. Fixation could be made by rivet or screw, which passes through the hole 75 of one segment and hole 71 of another segment, or by other connection means. By tightening two segments, e.g. by the screw, one can fix the angle 50 between the mentioned segments 10 and thus set a specified height and width 60 of the final assembly. In order to achieve better power dissipation from impedance elements 20, the impedance elements 20 can be located under set angle 50 which is smaller than 180°. This arrangement can also result in longer creepage distance of the functional parts comparing to the standard solution used in FIG. 1, which can give bigger dielectric behavior.

Insulating support 30 has in addition two small holes 76 and 77. The output wire 21 from impedance element 20 passes through one of these holes, depending on size and configuration of selected impedance element 20. On the other side of insulating support 30 there are two conductive elements 78 and 79. Each of them has one hole 72 and 74 respectively, which size corresponds to the holes 76 and 77 on the other side, and one oval opening 70 and 73, respectively. These holes and openings are provided for electrical interconnection of impedance elements 20 on different segments. Under a condition where hole 72 is used for soldering of one end of impedance element on the conductive element 78 of the insulating support 30, one end of impedance element from the other segment should be connected to the same conductive element 78, and soldered through the oval opening 70, or arc-shaped opening 70, in order to provide necessary electrical interconnection. Oval opening 70 allows soldering of resistive element 20 in a place that is the most suitable for set angle 50.

Under a condition in which longer impedance element 20 is used, conductive element 79 could be used instead of conductive element 78 and/or hole 76 could be used instead of hole 77 on the other side of insulating support 30.

Figure 5A:
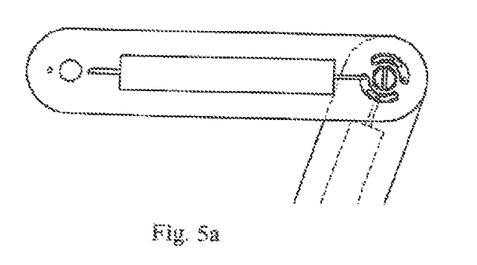
FIGS. 5a and 5b illustrate exemplary interconnection schemes of the insulating supports in accordance with an exemplary embodiment of the present disclosure.
Figure 5B:
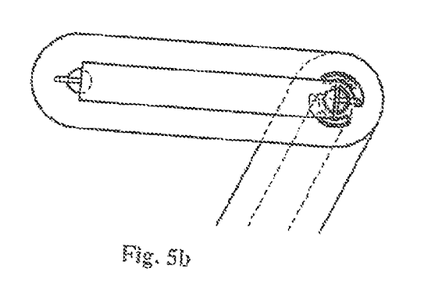

FIGS. 5a and 5b illustrate exemplary interconnection schemes of the insulating supports in accordance with an exemplary embodiment of the present disclosure. In addition, the connection system 40 allows to place impedance a) with a gap, as shown in FIG. 5a, b) crossed, like shown in FIG. 5b.

Connection with gap can be used in case the impedance elements are not too long. In such a case all impedances could be placed on the same side of all segments as there is no space constraint. Alternating side placement could be applied as well, in order to achieve better power dissipation from impedance elements used.

Under the condition of long impedance, crossed connection according to FIG. 5b can be used. For this configuration, alternating side placement could be the only possible placement of impedance elements 20 in order to have the smallest width of final assembly.

Figure 6:
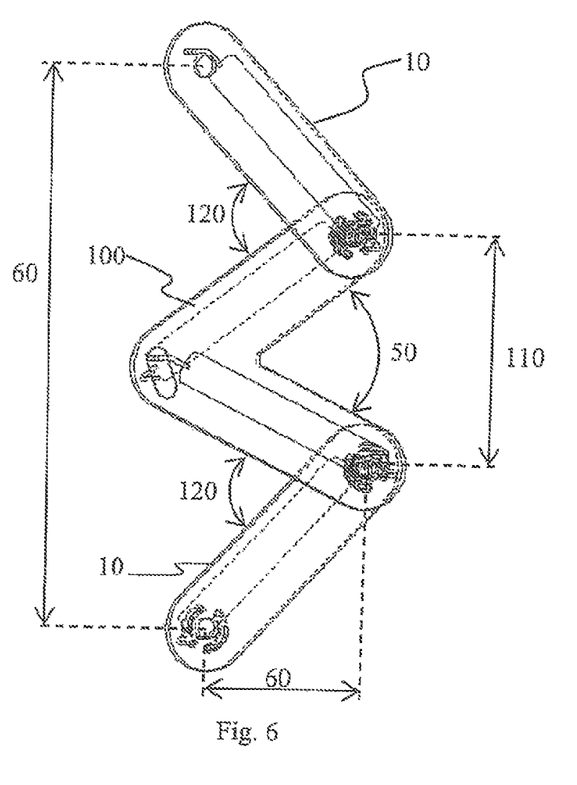
FIG. 6 illustrates a fixed and partly fixed arrangement of impedance elements in accordance with an exemplary embodiment of the present disclosure.

FIG. 6 illustrates a fixed and partly fixed arrangement of impedance elements in accordance with an exemplary embodiment of the present disclosure. As shown in FIG. 6: a) Partly fixed configuration can include a fixed element 100 which contains at least one impedance element 20, and at least one flexible segment 10. Dimensions 60 and angle 120 are still adaptable, but the angle 50 on fixed element is fixed; and b) Fixed configuration contains only fixed element 110 with at least one impedance element 20. Dimensions 60 and angle 50 are fixed. In that case the insulating support 30 consists of several segment supports.

FIG. 6 illustrates an exemplary interconnection of two segments forming fixed configuration, but there could be also 3 segments in "Z" configuration, or other suitable configuration as desired, with the possibility to have more than one branch of the final configuration forming a single body/support which does not need and does not have the capacity to be adjusted. Such fixed support, if produced as a standard part, can be reduced in height by breaking or cutting off the unused part of said support.

In order to reach a specified value for impedances designed for a voltage divider application, impedance elements could be assembled to the segments 10 and these segments connected in series, thus increasing total impedance of the divider. In order to decrease production costs or to maintain power levels, it can be advantageous to use standard, and thus cheaper, impedance elements which are connected within given segment in parallel and/or in series, providing required impedance value.

Preferred solution of impedance divider is using resistive elements, but it can use also capacitive elements or even combination of both.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

POSITION NUMBERS

1 High voltage impedance; resistor part
2 Low voltage impedance
3 Insulating sensor body
10 Segment
20 impedance element, resistive element
21 connector
30 insulating support
40 connection system
50 change angle
60 dimensions
70 oval opening
71 hole 72 hole
73 oval opening
74 hole
75 hole
76 hole
77 hole
78 conductive element
79 conductive element
100 fixed element
110 fixed element
120 angle

What is claimed is:

1. A voltage sensor device, comprising:
a first segment and a second segment, each segment comprising an elongated insulating support with a connection hole through which the first and second segments are fixed to each other, the first and second segments being pivotal relative to each other around the connection holes;
the first and second segments each comprising an impedance element, the impedance element of each first and second segment being flat and arranged on one or both sides of the respective elongated insulating support without being coiled around the respective elongated insulating support; and
the elongated insulating support of the first segment having a conductive element with a hole and an arc-shaped opening, one end of the impedance element of the first segment being electrically connected to the conductive element through the hole, and one end of the impedance element of the second segment being electrically connected to the conductive element through the arc-shaped opening.

2. The voltage sensor device according to claim 1, wherein the first and second segments are low voltage impedance elements arranged with a relative position under an angle which is smaller than 180°.

3. The voltage sensor device according to claim 1, wherein a resulting value of low voltage impedance can be built up together from at least one standard impedance value of the first and second segments.

4. The voltage sensor device according to claim 1, wherein the impedance elements are either resistive elements or capacitive elements or combination of both.

5. The voltage sensor device according to claim 1, wherein the first and second segments comprise low voltage impedance elements that are connected with the at least one high voltage segment in parallel and/or in series based on a specified impedance value.

6. The voltage sensor device according to claim 1, further comprising a plurality of impedance elements connected to the first or second segment that are assembled into at least one fixed configuration having with at least one fixed dimension and at least one fixed angle between elements, the at least one fixed configuration having a main fixed insulating support.

7. The voltage sensor device according to claim 6, wherein the main fixed insulating support mechanically reduces the number of elements by breaking or cutting off the unused part of said support.

* * * * *